United States Patent
Zuo

(10) Patent No.: US 12,238,901 B2
(45) Date of Patent: Feb. 25, 2025

(54) RADIATOR WITH TOP LAYER COOLANT TANK

(71) Applicant: Dell Products L.P., Round Rock, TX (US)

(72) Inventor: Weidong Zuo, Shrewsbury, MA (US)

(73) Assignee: Dell Products L.P., Round Rock, TX (US)

( * ) Notice: Subject to any disclaimer, the term of this patent is extended or adjusted under 35 U.S.C. 154(b) by 240 days.

(21) Appl. No.: 17/862,901

(22) Filed: Jul. 12, 2022

(65) Prior Publication Data
US 2024/0023288 A1    Jan. 18, 2024

(51) Int. Cl.
F28F 27/00    (2006.01)
H05K 7/20    (2006.01)

(52) U.S. Cl.
CPC ..... *H05K 7/20781* (2013.01); *H05K 7/20263* (2013.01); *H05K 7/20272* (2013.01); *H05K 7/20281* (2013.01)

(58) Field of Classification Search
CPC ........... H05K 7/20781; H05K 7/20263; H05K 7/20272; H05K 7/20281
USPC ....................................................... 165/301
See application file for complete search history.

(56) References Cited

U.S. PATENT DOCUMENTS

2009/0065178 A1 *   3/2009   Kasezawa ............. H01L 23/473
                                                                        165/104.19

FOREIGN PATENT DOCUMENTS

JP    2006329052 A  *  12/2006
JP       3897024 B2 *   3/2007
JP    2007200915 A  *   8/2007

OTHER PUBLICATIONS

M.K. Sapra et al., "Design and development of innovative passive valves for Nuclear Power Plant applications," Nuclear Engineering and Design, vol. 286, May 2016, pp. 195-204 (available at https://www.sciencedirect.com/science/article/abs/pii/S0029549315001065).
Restek Passive Inlet Valve (https://www.restek.com/p/25763).
IEP Technologies Passive Isolation Valve (https://www.ieptechnologies.com/whats-the-solution/isolation-devices/isoflap).

* cited by examiner

*Primary Examiner* — Davis D Hwu
(74) *Attorney, Agent, or Firm* — Jackson Walker L.L.P.

(57) ABSTRACT

A radiator for use in a liquid cooling system may have an inlet for receiving coolant fluid, an outlet for expelling coolant fluid, a plurality of radiating fins fluidically coupled between the inlet and the outlet such that coolant fluid flowing through the radiating fins radiates heat proximate to air proximate to the radiating fins, and a coolant reserve tank fluidically coupled to the plurality of radiating fins and oriented relative to the plurality of radiating fins such that a largest dimension of the coolant reserve tank is generally parallel to a flow of coolant fluid through the plurality of radiating fins. The coolant reserve tank may be configured to store excess coolant fluid and deliver at least a portion of the excess coolant fluid to fluidic pathways of the radiator in response to a decrease in volume of coolant fluid within the liquid cooling system.

12 Claims, 2 Drawing Sheets

RADIATOR WITH TOP LAYER COOLANT TANK

TECHNICAL FIELD

The present disclosure relates in general to information handling systems, and more particularly to excess coolant storage in liquid-cooled information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

To control temperature of components of an information handling system, an air mover may direct air over one or more heatsinks thermally coupled to individual components. Traditional approaches to cooling components may include a "passive" cooling system that serves to reject heat of a component to air driven by one or more system-level air movers (e.g., fans) for cooling multiple components of an information handling system in addition to the peripheral component. Another traditional approach may include an "active" cooling system that uses liquid cooling, in which a heat-exchanging cold plate is thermally coupled to the component, and a chilled fluid is passed through conduits internal to the cold plate to remove heat from the component.

However, one disadvantage to using liquid cooling is that coolant liquid may evaporate through certain components (e.g., pumps, soft fluid conduits) of a liquid cooling system, decreasing the volume of coolant in the liquid cooling system, which may decrease the cooling effectiveness of the liquid cooling system.

An existing solution to such disadvantage is the inclusion of a radiator within the liquid cooling system, wherein the radiator includes side coolant tanks that run from the top to the bottom of a height of the radiator at one or two edges of the radiator, such that the largest dimension of such side coolant tanks is substantially perpendicular to the direction of fluid flow through the radiator. The use of side coolant tanks may negatively affect volume of radiator fins, such that for a similarly-sized radiator, an increase in side coolant tank volume requires a decrease in radiator fin volume.

SUMMARY

In accordance with the teachings of the present disclosure, the disadvantages and problems associated with existing approaches for mitigating evaporation of coolant from liquid cooling systems may be substantially reduced or eliminated.

In accordance with embodiments of the present disclosure, an information handling system may include an information handling resource and a liquid cooling system for providing cooling of the information handling resource. The liquid cooling system may include a radiator having an inlet for receiving coolant fluid, an outlet for expelling coolant fluid, a plurality of radiating fins fluidically coupled between the inlet and the outlet such that coolant fluid flowing through the radiating fins radiates heat proximate to air proximate to the radiating fins, and a coolant reserve tank fluidically coupled to the plurality of radiating fins and oriented relative to the plurality of radiating fins such that a largest dimension of the coolant reserve tank is generally parallel to a flow of coolant fluid through the plurality of radiating fins. The coolant reserve tank may be configured to store excess coolant fluid and deliver at least a portion of the excess coolant fluid to fluidic pathways of the radiator in response to a decrease in volume of coolant fluid within the liquid cooling system.

In accordance with these and other embodiments of the present disclosure, a radiator for use in a liquid cooling system may have an inlet for receiving coolant fluid, an outlet for expelling coolant fluid, a plurality of radiating fins fluidically coupled between the inlet and the outlet such that coolant fluid flowing through the radiating fins radiates heat proximate to air proximate to the radiating fins, and a coolant reserve tank fluidically coupled to the plurality of radiating fins and oriented relative to the plurality of radiating fins such that a largest dimension of the coolant reserve tank is generally parallel to a flow of coolant fluid through the plurality of radiating fins. The coolant reserve tank may be configured to store excess coolant fluid and deliver at least a portion of the excess coolant fluid to fluidic pathways of the radiator in response to a decrease in volume of coolant fluid within the liquid cooling system.

In accordance with these and other embodiments of the present disclosure, a method may include fluidically coupling a plurality of radiating fins of a radiator between an inlet for receiving coolant fluid and an outlet for expelling coolant fluid such that coolant fluid flowing through the radiating fins radiates heat proximate to air proximate to the radiating fins. The method may also include fluidically coupling a coolant reserve tank to the plurality of radiating fins and oriented relative to the plurality of radiating fins such that a largest dimension of the coolant reserve tank is generally parallel to a flow of coolant fluid through the plurality of radiating fins, wherein the coolant reserve tank is configured to store excess coolant fluid and deliver at least a portion of the excess coolant fluid to fluidic pathways of the radiator in response to a decrease in volume of coolant fluid within a liquid cooling system comprising the radiator.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
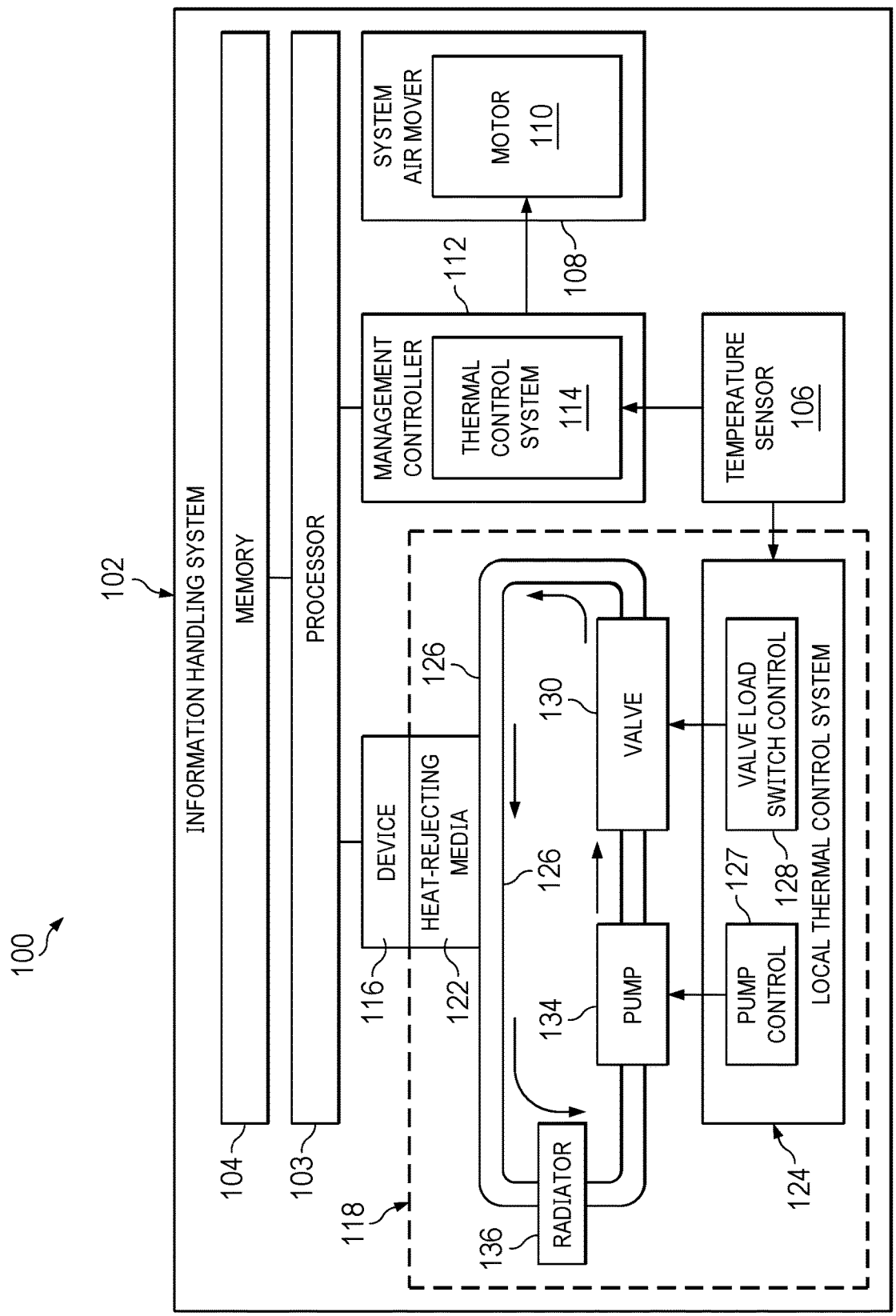
FIG. 1 illustrates a block diagram of selected components of an example information handling system, in accordance with embodiments of the present disclosure.
Figure 2:
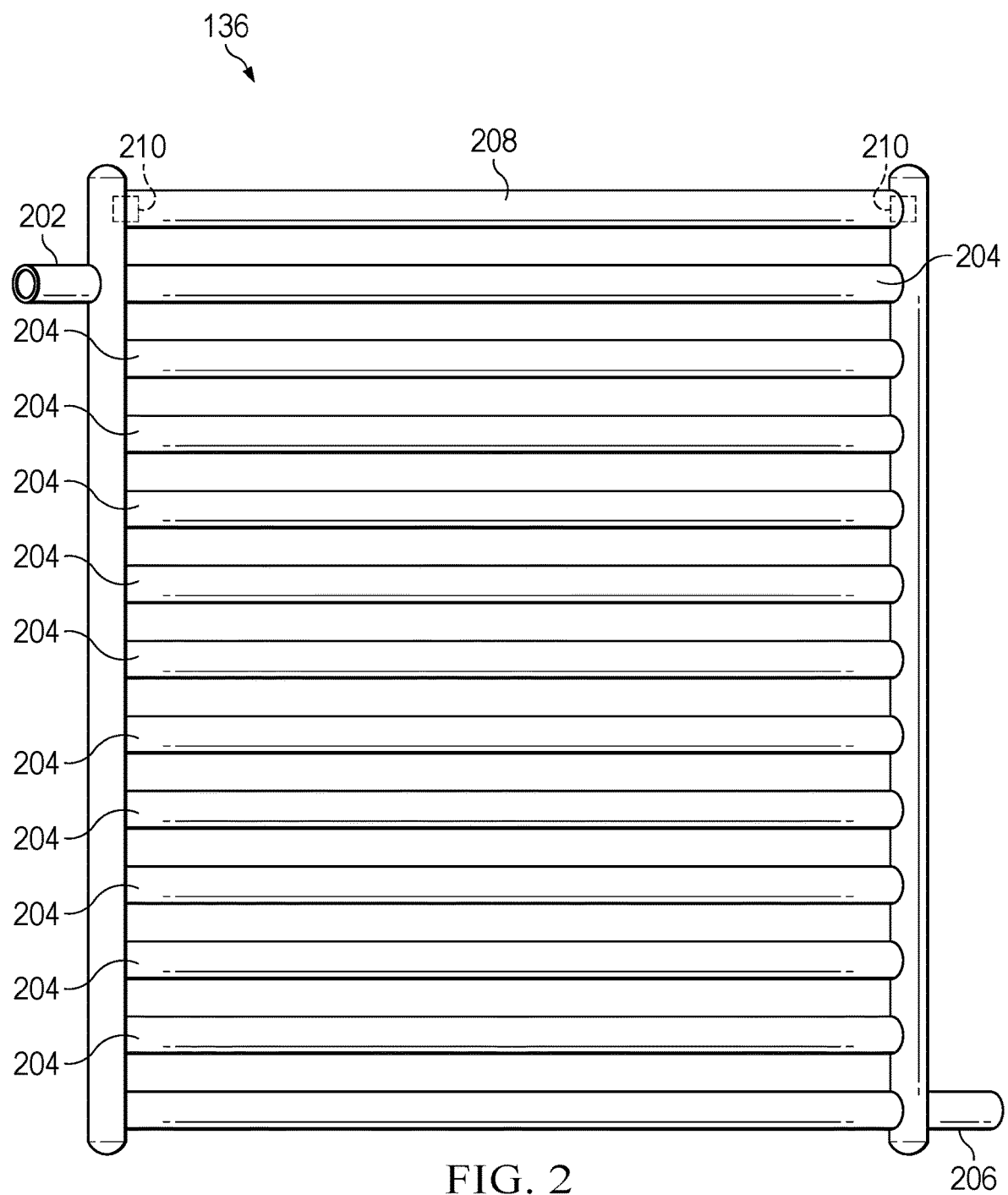
FIG. 2 illustrates of an example radiator, in accordance with embodiments of the present disclosure.

Preferred embodiments and their advantages are best understood by reference to FIGS. 1 and 2, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

FIG. 1 illustrates a block diagram of selected components of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data. As shown in FIG. 1, information handling system 102 may include a chassis 100 housing a processor 103, a memory 104, a temperature sensor 106, a system air mover 108, a management controller 112, a device 116, and an active liquid cooling system 118.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

System air mover 108 may include any mechanical or electro-mechanical system, apparatus, or device operable to move air and/or other gases in order to cool information handling resources of information handling system 102. In some embodiments, system air mover 108 may comprise a fan (e.g., a rotating arrangement of vanes or blades which act on the air). In other embodiments, system air mover 108 may comprise a blower (e.g., a centrifugal fan that employs rotating impellers to accelerate air received at its intake and change the direction of the airflow). In these and other embodiments, rotating and other moving components of system air mover 108 may be driven by a motor 110. The rotational speed of motor 110 may be controlled by an air mover control signal communicated from thermal control system 114 of management controller 112. In operation, system air mover 108 may cool information handling resources of information handling system 102 by drawing cool air into an enclosure housing the information handling resources from outside the chassis, expel warm air from inside the enclosure to the outside of such enclosure, and/or move air across one or more heat sinks (not explicitly shown) internal to the enclosure to cool one or more information handling resources.

Management controller 112 may comprise any system, device, or apparatus configured to facilitate management and/or control of information handling system 102 and/or one or more of its component information handling resources. Management controller 112 may be configured to issue commands and/or other signals to manage and/or control information handling system 102 and/or its information handling resources. Management controller 112 may comprise a microprocessor, microcontroller, DSP, ASIC, field programmable gate array ("FPGA"), EEPROM, or any combination thereof. Management controller 112 also may be configured to provide out-of-band management facilities for management of information handling system 102. Such management may be made by management controller 112 even if information handling system 102 is powered off or powered to a standby state. In certain embodiments, management controller 112 may include or may be an integral part of a baseboard management controller (BMC), a remote access controller (e.g., a Dell Remote Access Controller or Integrated Dell Remote Access Controller), or an enclosure controller. In other embodiments, management controller 112 may include or may be an integral part of a chassis management controller (CMC).

As shown in FIG. 1, management controller 112 may include a thermal control system 114. Thermal control system 114 may include any system, device, or apparatus configured to receive one or more signals indicative of one or more temperatures within information handling system 102 (e.g., one or more signals from one or more temperature sensors 106), and based on such signals, calculate an air mover driving signal to maintain an appropriate level of cooling, increase cooling, or decrease cooling, as appropriate, and communicate such air mover driving signal to system air mover 108. In these and other embodiments, thermal control system 114 may be configured to receive information from other information handling resources and calculate the air mover driving signal based on such received information in addition to temperature information. For example, as described in greater detail below, thermal control system 114 may receive configuration data from device 116 and/or other information handling resources of information handling system 102, which may include thermal requirement information of one or more information handling resources. In addition to temperature information collected from sensors within information handling system 102, thermal control system 114 may also calculate the air mover driving signal based on such information received from information handling resources.

Temperature sensor 106 may be any system, device, or apparatus (e.g., a thermometer, thermistor, etc.) configured to communicate a signal to processor 103 or another controller indicative of a temperature within information handling system 102. In many embodiments, information handling system 102 may comprise a plurality of temperature sensors 106, wherein each temperature sensor 106 detects a temperature of a particular component and/or location within information handling system 102.

Device 116 may comprise any component information handling system of information handling system 102, including without limitation processors, buses, memories, I/O devices and/or interfaces, storage resources, network interfaces, motherboards, integrated circuit packages; electro-mechanical devices, displays, and power supplies.

Oftentimes, an architecture of information handling system 102 may be such that device 116 may be significantly downstream of system air mover 108 that it may be significantly more effective for device 116 to be cooled using active liquid cooling system 118. As shown in FIG. 1, active liquid cooling system 118 may include a local thermal control system 124, heat-rejecting media 122, pump 134, radiator 136, valve 130, and fluidic conduits 126.

Local thermal control system 124 may be communicatively coupled to temperature sensor 106, and may include any system, device, or apparatus (e.g., a processor, controller, etc.) configured to control components of an active liquid cooling system for cooling a temperature of one or more information handling resources of information handling system 102. For example, local thermal control system 124 may be configured to control pump 134 and/or valve 130 based on thermal data sensed by temperature sensor 106, so as to maintain a safe operating temperature for one or more information handling resources. Accordingly, local thermal control system 124 may include a pump control subsystem 127 for controlling operation of pump 134 (e.g., a pressure applied to coolant fluid in fluidic conduits 126 for moving such fluid through fluidic conduits 126) and a valve load switch control subsystem 128 for controlling operation of valve 130 (e.g., opening or closing valve 130, controlling an aperture of valve 130, etc.).

Pump 134 may be fluidically coupled to one or more fluidic conduits 126 and may comprise any mechanical or electro-mechanical system, apparatus, or device operable to produce a flow of fluid (e.g., fluid in one or more conduits 126). For example, pump 134 may produce fluid flow by applying a pressure to fluid in fluidic conduits 126. As described above, operation of pump 134 may be controlled by pump control subsystem 127 which may control electro-mechanical components of pump 134 in order to produce a desired rate of coolant flow.

Radiator 136 may include any device, system or apparatus configured to transfer thermal energy from one medium (e.g., fluid within a fluidic conduit 126) to another (e.g., air external to chassis 100) for the purpose of cooling and heating. In some embodiments, radiator 136 may include fluidic channels and/or conduits in at least a portion of radiator 136. Such fluidic channels and/or conduits may be fluidically coupled to one or more of fluidic conduits 126 and pump 134.

Valve 130 may include any device, system or apparatus that regulates, directs, and/or controls the flow of a fluid (e.g., a coolant liquid in fluidic conduits 126) by opening, closing, or partially obstructing one or more passageways. When valve 130 is open, coolant liquid may flow in a direction from higher pressure to lower pressure. As described above, the operation of valve 130 (e.g., opening and closing, size of an aperture of valve 130) may be controlled by valve load switch control subsystem 128.

In operation, pump 134 may induce a flow of liquid (e.g., water, ethylene glycol, propylene glycol, or other coolant) through various fluidic conduits 126 of information handling system 102, valve 130 and/or radiator 136. As fluid passes by heat-rejecting media 122 in a fluidic conduit 126 proximate to device 116, heat may be transferred from device 116 to heat-rejecting media 122 and from heat-rejecting media 122 to the liquid coolant in fluidic conduit 126. As such heated coolant flows by radiator 136, heat from the coolant may be transferred from the coolant to air ambient to chassis 100, thus cooling the fluid.

Heat-rejecting media 122 may include any system, device, or apparatus configured to transfer heat from an information handling resource (e.g., device 116, as shown in FIG. 1), thus reducing a temperature of the information handling resource. For example, heat-rejecting media 122 may include a solid thermally coupled to the information handling resource (e.g., heatpipe, heat spreader, heatsink, finstack, etc.) such that heat generated by the information handling resource is transferred from the information handling resource.

In addition to processor 103, memory 104, temperature sensor 106, air mover 108, management controller 112, device 116, and active liquid cooling system 118, information handling system 102 may include one or more other information handling resources. In addition, for the sake of clarity and exposition of the present disclosure, FIG. 1 depicts only one system air mover 108 and one device 116. In embodiments of the present disclosure, information handling system 102 may include any number of system air movers 108 and devices 116. Furthermore, for the sake of clarity and exposition of the present disclosure, FIG. 1 depicts device 116 including an active liquid cooling system 118 for active cooling of device 116. However, in some embodiments, approaches similar or identical to those used to actively cool device 116 as described herein may be employed to provide active cooling of processor 103, memory 104, management controller 112, and/or any other information handling resource of information handling system 102.

FIG. 2 illustrates an example radiator 136, in accordance with embodiments of the present disclosure. As shown in FIG. 2, radiator 136 may include an inlet 202, a plurality of radiating fins 204, an outlet 206, a coolant reserve tank 208, and valves 210.

In operation, under the influence of pump 134, coolant fluid may enter radiator 136 via inlet 202, flow through radiating fins 204 in which heat may be radiated from coolant fluid to air proximate to radiating fins 204, and then flow from radiator 136 via outlet 206.

As also shown in FIG. 2, radiator 202 may also include coolant reserve tank 208 for storing excess coolant fluid which may be used in the event that coolant fluid within liquid cooling system 118 evaporates and decreases in volume. As shown in FIG. 2, coolant reserve tank 208 may be sized and shaped and arranged such that the largest dimension of coolant reserve tank 208 (e.g., the length of coolant reserve tank from left to right in FIG. 2) may generally be parallel to the direction of fluid flow through radiating fins 204.

As further shown in FIG. 2, one or more valves 210 may be fluidically interfaced between coolant reserve tank 208 and radiating fins 204. In normal operation, valves 210 may remain closed, retaining coolant fluid within coolant reserve tank 208. However, responsive to a significant decrease in volume of coolant fluid within liquid cooling system 118, such valves 210 may open to allow coolant fluid to flow from coolant reserve tank 208 to the remainder of liquid cooling system 118. In some embodiments, such valves 210 may be actively-controlled valves that may be controlled by a control system configured to detect a decrease in volume of coolant fluid within liquid cooling system 118 and open valves 210 when such volume falls below a threshold. In other embodiments, such valves 210 may operate passively, for example on the basis of a pressure differential in which coolant fluid may flow through valves 210 from coolant reserve tank 208 to the remainder of liquid cooling system 118 when a pressure inside of coolant reserve tank 208 is greater than that within other fluidic passageways of liquid cooling system 118, as may happen when such fluidic passageways of liquid cooling system 118 experience a decrease in volume of coolant liquid.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
   an information handling resource; and a liquid cooling system for providing cooling of the information handling resource, wherein the liquid cooling system includes a radiator comprising:
an inlet for receiving coolant fluid;
an outlet for expelling coolant fluid;
a plurality of radiating fins fluidically coupled between the inlet and the outlet such that coolant fluid flowing through the radiating fins radiates heat proximate to air proximate to the radiating fins; and
a coolant reserve tank fluidically coupled to the plurality of radiating fins and oriented relative to the plurality of radiating fins such that a largest dimension of the coolant reserve tank is generally parallel to a flow of coolant fluid through the plurality of radiating fins, the coolant reserve tank configured to:
store excess coolant fluid; and
deliver at least a portion of the excess coolant fluid to fluidic pathways of the radiator in response to a decrease in volume of coolant fluid within the liquid cooling system.

2. The information handling system of claim 1, wherein the radiator further comprises at least one valve fluidically coupled between the coolant reserve tank and the plurality of radiating fins, the at least one valve configured to open in response to the decrease in volume of coolant fluid within the liquid cooling system.

3. The information handling system of claim 2, wherein the at least one valve comprises an actively-controlled valve configured to open in response to the decrease in volume of coolant fluid within the liquid cooling system.

4. The information handling system of claim 2, wherein the at least one valve comprises a passive valve configured to open in response to the decrease in volume of coolant fluid within the liquid cooling system.

5. A radiator for use in a liquid cooling system, the radiator comprising:
an inlet for receiving coolant fluid;
an outlet for expelling coolant fluid;
a plurality of radiating fins fluidically coupled between the inlet and the outlet such that coolant fluid flowing through the radiating fins radiates heat proximate to air proximate to the radiating fins; and
a coolant reserve tank fluidically coupled to the plurality of radiating fins and oriented relative to the plurality of radiating fins such that a largest dimension of the coolant reserve tank is generally parallel to a flow of coolant fluid through the plurality of radiating fins, the coolant reserve tank configured to:
store excess coolant fluid; and
deliver at least a portion of the excess coolant fluid to fluidic pathways of the radiator in response to a decrease in volume of coolant fluid within the liquid cooling system.

6. The radiator of claim 5, further comprising at least one valve fluidically coupled between the coolant reserve tank and the plurality of radiating fins, the at least one valve configured to open in response to the decrease in volume of coolant fluid within the liquid cooling system.

7. The radiator of claim 6, wherein the at least one valve comprises an actively-controlled valve configured to open in response to the decrease in volume of coolant fluid within the liquid cooling system.

8. The radiator of claim 6, wherein the at least one valve comprises a passive valve configured to open in response to the decrease in volume of coolant fluid within the liquid cooling system.

9. A method, comprising:
fluidically coupling a plurality of radiating fins of a radiator between an inlet for receiving coolant fluid and an outlet for expelling coolant fluid such that coolant fluid flowing through the radiating fins radiates heat proximate to air proximate to the radiating fins;
fluidically coupling a coolant reserve tank to the plurality of radiating fins and oriented relative to the plurality of radiating fins such that a largest dimension of the coolant reserve tank is generally parallel to a flow of coolant fluid through the plurality of radiating fins, wherein the coolant reserve tank is configured to:
store excess coolant fluid; and
deliver at least a portion of the excess coolant fluid to fluidic pathways of the radiator in response to a decrease in volume of coolant fluid within a liquid cooling system comprising the radiator.

10. The method of claim 9, further comprising fluidically coupling at least one valve between the coolant reserve tank and the plurality of radiating fins, the at least one valve configured to open in response to the decrease in volume of coolant fluid within the liquid cooling system.

11. The method of claim 10, wherein the at least one valve comprises an actively-controlled valve configured to open in response to the decrease in volume of coolant fluid within the liquid cooling system.

12. The radiator of claim 10, wherein the at least one valve comprises a passive valve configured to open in response to the decrease in volume of coolant fluid within the liquid cooling system.

* * * * *